(12) United States Patent
Tooher et al.

(10) Patent No.: US 6,977,860 B1
(45) Date of Patent: Dec. 20, 2005

(54) SRAM POWER REDUCTION

(75) Inventors: Michael J. Tooher, Mountain View, CA (US); John M. Callahan, San Ramon, CA (US)

(73) Assignee: Virtual Silicon Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/851,767

(22) Filed: May 22, 2004

(51) Int. Cl.[7] ................................................ G11C 8/00
(52) U.S. Cl. ............ 365/230.03; 365/188; 365/230.02; 365/227
(58) Field of Search ...................... 365/230.03, 189.02, 365/230.02, 227, 63, 207

(56) References Cited

U.S. PATENT DOCUMENTS 6,212,109 B1 * 4/2001 Proebsting .................. 365/190
6,608,772 B2 * 8/2003 Ooishi ......................... 365/63
6,735,144 B2 * 5/2004 Maesako et al. ........ 365/230.03

* cited by examiner

Primary Examiner—Tuan T. Nguyen
(74) Attorney, Agent, or Firm—Patrick T. King

(57) ABSTRACT

A SRAM uses a number of memory banks in a configuration that uses lower voltage swings on a differential internal data bus so that the internal data bus no longer uses single-ended VDD/VSS, HIGH-to-LOW, rail-to-rail voltage swing for a read mode of operation. This consumes less power for a read operation. Senseamps for finally converting low-level signals to full logic output voltage levels are located right next to output buffers and data output pads for the SRAM. The bit lines for a memory CORE are formed in lower metal layers that are closer to the core memory cells and, thus, have higher capacitance. The present invention uses lower-capacitance top layers 4–6 of a 6 metal layer scheme for the signal lines of the differential internal data bus. An optimum configuration has the capacitance of a bitline equal to the capacitance of the differential internal data bus bit-line.

17 Claims, 7 Drawing Sheets

SRAM POWER REDUCTION

BACKGROUND OF THE INVENTION

1. Field of the Invention

This invention relates to semiconductor integrated-circuit memories and, more particularly, to a static random access integrated-circuit memory(SRAM) with reduced power consumption in a read mode of operation.

2. Prior Art

Previously, reductions in power in a SRAM have been obtained by using a fabrication process with higher impedance devices and with higher thresholds to reduce current drain. Note that in this document inverted or complementary items, such as signals, are designated by adding a * character to the designation of a non-inverted item. Drawing references use an overstrike to designate an inverted item.

FIG. 1 illustrates a six transistor (6T) CMOS latch SRAM memory-cell circuit 10 that includes a first CMOS inverter pair and a second CMOS inverter pair. The first CMOS inverter pair is provided by a first PMOS transistor 12 and a first NMOS transistor 14. A source terminal of the first PMOS transistor 12 is connected to a VCC voltage terminal. A source terminal of the first NMOS transistor 14 is connected to a VSS ground terminal. An inverted output terminal 20 of the first CMOS inverter pair is connected to a drain terminal of the first NMOS transistor 14 and to a drain terminal of the first PMOS transistor 12. An input terminal 22 of the first CMOS inverter pair is connected to gate terminals of the first PMOS transistor 12 and the first NMOS transistor 14.

The second CMOS inverter pair is provided by a second PMOS transistor 24 and a second NMOS transistor 26. A source terminal of the second PMOS transistor 26 is connected to a VCC voltage terminal. A source terminal of the second NMOS transistor 24 is connected to a VSS ground terminal. An inverted output terminal 28 of the second CMOS inverter pair is connected to a drain terminal of the second NMOS transistor 26 and to a drain terminal of the second PMOS transistor 24. An input terminal 30 of the second CMOS inverter pair is connected to gate terminals of the second PMOS transistor 24 and the second NMOS transistor 26.

To provide the memory-cell latch circuit 10, the inverter pairs are cross-coupled by having the inverted output terminal 20 of the first CMOS inverter pair connected to the input terminal 30 of the second CMOS inverter pair and by having the inverted output terminal 28 of the second CMOS inverter pair connected to the input terminal 22 of the first CMOS pair.

A first gating transistor 32 connects a bitline B0 to terminals 20, 30 of the latch circuit 10. A second gating transistor 34 connects an inverted bitline B0* to the latch. The bit line B0 and the inverted bit line B0* are used to write and to read data to and from the latch circuit 10. A local word line LWL is connected to gate terminals of the gating transistors 32, 34. A positive signal on the LWL turns on gating transistors 32,34 and connects the bit line and the inverted bit line to respective output terminals 20,28 of the latch.

In a SRAM, the memory cells are arranged in rows and columns in banks of memory cells. For reading a memory cell, the bit lines and inverted bit lines are precharged to a positive voltage. When a local word line is selected, the CMOS inverter pair that has a low voltage at its output terminal pulls down the bit line or inverted bit line approximately 150 mv. At the same time, when the other CMOS inverter pair that has a high voltage at its output terminal is connected to the bit line or inverted bit line, that bit line or inverted bit line does not change voltage. For a conventional SRAM, the small 150 mv voltage differential between the bit line and the inverted bit line is then passed through a YMUX circuit to a sense amplifier, which converts the differential voltage signal to a much larger full logic-level voltage signal.

The memory cells in a particular row are addressed for reading or writing by corresponding local word lines. A local word line is bank-selected from a global wordline. All of the memory cells in a particular column of a bank share the same bit lines and inverted bit lines.

Note that a signal on the local word line LWL addresses other memory cells in other columns that are not currently connected through a YMUX circuit to a sense amplifier. For example, the local word line LWL addresses four columns that have their bit lines and inverted bit lines connected to input terminals of a 4:1 YMUX circuit. Only one of those four memory columns is hooked through a YMUX to a sense amplifier. This means that the other three memory cells are discharging their bit lines for no purpose and are wasting power in the core of a memory bank.

FIG. 2 illustrates the architecture of a prior art SRAM 50 that includes a number of memory banks that are typically illustrated as eight memory banks 0–7, with only one of the memory banks being used at a time. A typical memory core 52 is shown for bank3 and each memory bank is similarly configured. A typical memory bank3 includes a memory core, typically illustrated as 52, that has a number of the memory cell circuits, each of which, as typically illustrated in FIG. 1, is arranged in x rows and y columns. Each memory cell is addressed by a corresponding x,y address signal. Each row in a memory bank is addressed by a local word line LWL. Each memory cell in a column is connected through gating transistors in each memory cell to a bitline and an inverted bitline for that particular column of memory cells.

The SRAM 50 has a global word line decoder 54 that decodes x address signals and that provides a global word line signal on a GWL signal line 56 for corresponding word lines in the memory banks. The global word line signal is then further decoded to provide a local word line for each bank by using an appropriate bank select signal.

The SRAM 50 has a Y-decoder circuit 58 that decodes y address signals for a particular column in a particular memory bank. Each memory bank has a corresponding YMUX circuit, typically shown for memory bank 3 as 60, for selecting that particular memory column.

Assuming that each memory bank has 16 columns arranged as four groups of four columns each, the YMUX circuit 60 has four pairs of input terminals, one pair of input terminals for each pair of bit line and inverted bit line signals. Each YMUX circuit provides one of four input signals to one of a group of four differential-input sense amplifier, typically shown for the bank3 as 62. Appropriate timing and control signals for the sense amplifiers are provided by a control circuit 64. Each differential sense amplifier then provides a single-ended output bit signal to one signal line of an internal data bus 66 that has four signal lines.

Each of the memory banks has its sense amplifier located underneath the memory bank. The sense amplifier detects low-level voltages or voltage differences from a memory circuit and amplifies those low-level signals to full logic voltage levels. These low-levels signals are on the order of 150 millivolts while the full logic voltage output signals are in the order of one or more volts. The full logic voltage output signals of the sense amplifiers are then fed into the internal databus that links the various memory banks together. The internal data bus 66 provides those full logic voltage levels to output buffers and thence to output pads or terminals of the SRAM. With this arrangement, there are full high-to-low, rail-to-rail, logic voltage swings on the internal data bus.

FIG. 3 illustrates an example of a 4:1 y-multiplexer (YMUX) circuit 70 and a sense amplifier 72 used in the prior art SRAM 50 described in connection with FIG. 2. The YMUX circuit 70 has four pairs of PMOS selection transistors 80,81; 82,83; 84,85; 88,87. The drain terminals of each of the PMOS selection transistors are connected to a respective bit line or an inverted bit line of one of the four columns COL0-COL 3 of a memory core array. Respective input terminals 88, 89, 90, 91 of the YMUX circuit 70 are connected to respective gate terminals of the four pairs of PMOS selection transistors 80,81; 82,83; 84,85; 88,87. All of the output terminals of the PMOS selection transistors 80, 82, 84, 86 for bit lines are connected together at an input IN terminal of the sense amplifier 72. Similarly all of the output terminals of the PMOS selection transistors 81, 83, 85, 87 for the inverted bit lines are connected together at the inverted input IN* terminal of the sense amplifier 72. The sense amplifier 72 has a single-ended output terminal 90 that is connected to one of the bit lines of an internal data bus 92. The internal data bus is connected through a data out buffer 94 to a package pad 96. Similar circuits are provided for the other output bits.

The small 150 mv voltage differential between the bit line and the inverted bit line is passed through the YMUX circuit 70 to the sense amplifier 72. Control signals for the various sense amplifiers are passed through control lines 98a, 98b. The sense amplifier 72 provides a full rail-to-rail VSS-VDD voltage swing on the internal data bus. Using lower supply voltages for an SRAM can reduce power drain because power drain is proportional to the square of the supply voltage. Power consumed in driving a signal line in an SRAM is proportional to the signal voltage swing, the total capacitance of the signal line, and the frequency of the signals on the signal line.

A prior art SRAM with 20 output bits uses an internal data bus of 20 lines, each of which can swing from VDD to VSS. Only one pair of the PMOS selection transistors 80,81; 82,83; 84,85; 88,87 is turned on at any one time to select one of the columns COL0, COL1, COL2, COL3. As previously mentioned, a signal on a local word line LWL also addresses three other memory cells in other columns that, however, are not currently connected through the YMUX circuit 70 to the internal data bus and thence to the sense amplifier. The local word line LWL addresses four columns that all have their bit lines and inverted bit lines connected to the input terminals of the 4:1 YMUX circuit 70. However, only one of those four columns is coupled through the YMUX circuit 70 to the sense amplifier 72. This means that the other three unselected memory cells are discharging either a bit line or an inverted bit line for no purpose and are wasting power in the core.

In certain application, such as hearing aids, battery power drain is an important consideration. If less power is drawn from a hearing-aid battery, the battery will last longer before needing to be replaced. It should be appreciated that conserving any amount of battery power is important, particularly in low-power applications. For these and other applications, a need exists for a technique that reduces power drain in a SRAM during a read operation.

SUMMARY OF THE INVENTION

It is therefore an object of the invention to provide a SRAM with reduced power consumption for a read operation. A memory according to the present invention uses a number of memory banks, such as sixteen memory banks, in a configuration that incorporates lower voltage swings into a differential internal data bus so that the internal data bus no longer uses a single-ended HIGH to LOW, rail-to-rail voltage swing. This consumes less power. Sense amplifiers, or senseamps, for converting low-level to full logic voltage levels are located right next to output buffers. The output buffers are located right next to I/O pads. In a preferred embodiment of the invention differential sense amplifier/ output buffers are located beneath one end of the differential internal data bus near the SRAM data output terminals.

Conductive lines in a semiconductor integrated circuit are formed in metal or conductive layers that are formed over the top of active device structures. These conductive lines, generically referred to as metal lines, are capacitively coupled to adjacent structures and to other metal lines. Note that the capacitance per micron for an internal data bus in higher metal layers is much less than the capacitance per micron of the bit lines in lower metal layers. So for lower power, an optimum SRAM memory configuration has fewer rows with a lot more columns. To minimize total capacitance, one embodiment of the invention has the memory width, or number of columns, almost four times wider than its height, or number of rows. The bit lines for a memory core are formed in lower metal layers that are closer to the core memory cells and, thus, have higher capacitance. The present invention uses top layers 4–6 of a 6 metal layer scheme for the signal lines of a differential internal data bus. Higher-level metal lines have less capacitance than the lower metal lines that are closer to core memory cells.

The internal data bus runs along the wide width of the rows in all of the various memory banks. Typically, a 150 millivolt signal from the memory core is passed through the YMUX circuit to a point along the differential internal data bus. The senseamps are now part of the data out buffers and a located at one end of the internal data bus. A power savings is realized because the internal data bus voltage swings are now approximately 150 millivolts instead of a full logic, rail-to-rail voltage swing. For the present invention, the sense amps and data out buffers are built under one end of the the internal data bus.

The present invention provides a SRAM having an internal data bus with reduced internal signal levels to save power in a read mode of operation. The SRAM has a plurality of banks of memory cells, with each bank of memory cells having a memory-cell core in which the memory cells are arranged in word rows and bit columns. Each memory cell in a bank receives a local word line signal for selecting a row of memory cells and for connecting a selected memory cell of a particular column to a respective bit-line pair to provide a low-voltage differential voltage read-output signal from that memory cell to a bit-line pair for its respective bit column. A Y-multiplexer directly connects each bit-line pair of a respective column to one end of a corresponding pair of differential data bitlines of an internal data bus while substantially maintaining the low voltage differential voltage level signals on the pairs of differential data bitlines of the internal data bus. Differential sense amplifier/output buffers are each connected to the other end of a respective pair of differential data bitlines in an internal data bus. Each of the sense amplifier/output buffers receives a low voltage differential voltage level signal from a corresponding bit-line pair and each of the sense amplifier/output buffers has output signals that are full VDD/VSS logic-level signals. Adjacent to each of a plurality of SRAM data output terminals are located corresponding differential sense amplifier/output buffers that provides full logic level signals to that SRAM data output terminal. The internal data bus is a differential data bus that carries low voltage differential voltage level signals that are not full logic levels from memory cells to the differential sense amplifier/output buffers to thereby reduce power consumed by not driving full logic level signals through the internal data bus.

Bit-line pairs in a memory core are formed as twisted pairs and as adjacent twisted pairs in lower metal layers of the SRAM with horizontal twists. Lines of the differential data bitlines in the internal data bus are formed as twisted pairs and as adjacent twisted pairs in upper metal layers of the SRAM with both horizontal and vertical twists.

The capacitances of the bit-line pairs in each core of a memory bank are approximately the same as the capacitances of the internal data bus for all of the memory banks to minimize the total capacitance of the lines from the memory cell to the corresponding output terminals.

A global wordline decoder receives a row x address, along with a Bank Address, and provides the local word line signals for memory cells in a bank such that one bank at a time is accessed for a predetermined row in said bank. A Y-decoder circuit decodes y column address signals for a particular column in a particular memory bank. Appropriate timing and control signals for the sense amplifiers are provided by a control circuit.

The present invention also provides a method of routing signals through a SRAM. The method includes the steps of: arranging a plurality of banks of memory cells in rows and columns, with each bank of memory cells having a core in which the memory cells are arranged in word rows and bit columns, each memory cell in a bank receiving a local word line signal for selecting a row of memory cells and for connecting the memory cells of a column to a respective bit-line pair to provide a LOW VOLTAGE differential voltage signal from a memory cell to a bit-line pair for a respective bit column; directly connecting each bit-line pair of a respective columns through a Y-multiplexer circuit to one end of a corresponding pair of differential data bitlines in an internal data bus while substantially maintaining low voltage differential voltage level signals on the pairs of differential data bitlines of the internal data bus; connecting differential sense amplifier/output buffers to the other end of a respective pair of differential data bitlines in an internal data bus, each of said sense amplifier/output buffers receiving low voltage differential voltage level signals from a corresponding bit-line pair, and each of said sense amplifier/output buffers having output signals that are full logic level signals; locating corresponding differential sense amplifier/output buffers adjacent to one of a plurality of SRAM data output terminals, each of which buffers provides full logic level signals to that SRAM data output terminal. The method provides that the differential data bus carries low voltage differential voltage level signals that are not full logic levels from memory cells to the differential sense amplifier/output buffers to thereby reduce power consumed by not driving full logic level signals through the internal data bus.

The method also includes forming bit-line pairs in a memory core as twisted pairs and as adjacent twisted pairs in lower metal layers of the SRAM, with horizontal twists. The method includes forming lines of the differential data bitlines in the internal data bus as twisted pairs and as adjacent twisted pairs in upper metal layers of the SRAM, with horizontal and vertical twists. The method further includes forming the capacitance of the bit-line pairs in each core of a memory bank to be approximately the same as the capacitance of the internal data bus for all of the memory banks to minimize the total capacitance of the lines from a memory cell to an output terminal.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENT

Reference is now made in detail to one preferred embodiment of the invention, an example of which is illustrated in the accompanying drawings. While the invention is described in conjunction with the preferred embodiment, it will be understood that it is not intended to limit the invention to this embodiment. On the contrary, the invention is intended to cover alternatives, modifications and equivalents, which may be included within the spirit and scope of the invention as defined by the appended claims.

U.S. Pat. No. 6,657,880 entitled "SRAM BIT LINE ARCHITECTURE," granted to John M. Callahan on Dec. 2, 2003 describes both horizontal and vertical twisting of signal lines in a SRAM and is hereby incorporated by reference.

Figure 4:
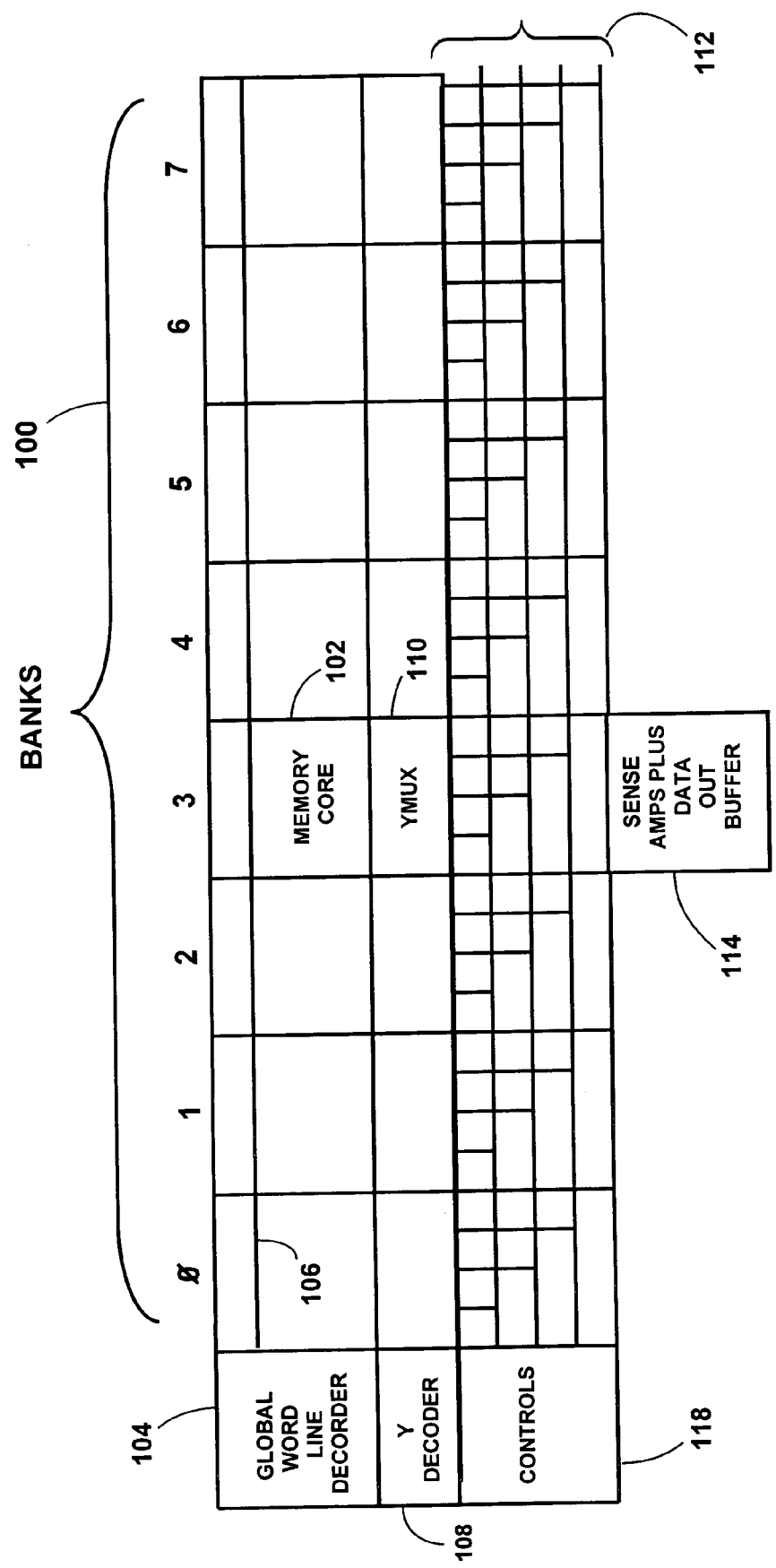
FIG. 4 is a schematic diagram of a SRAM memory chip according to the present invention.

FIG. 4 schematically illustrates a basic architecture of an exemplary SRAM 100, according to the present invention. As described below, the SRAM 100 has reduced power consumption because it maintains the 150 mv signal levels from bit lines on an internal data bus. The internal data bus does not have full logic level signals for Read Mode. Instead of having sense amplifiers located near memory cells for converting low-level signals to full logic voltage levels, the present invention has sense amplifiers that are located next to output buffers near the I/O pads for the SRAM.

Figure 1:
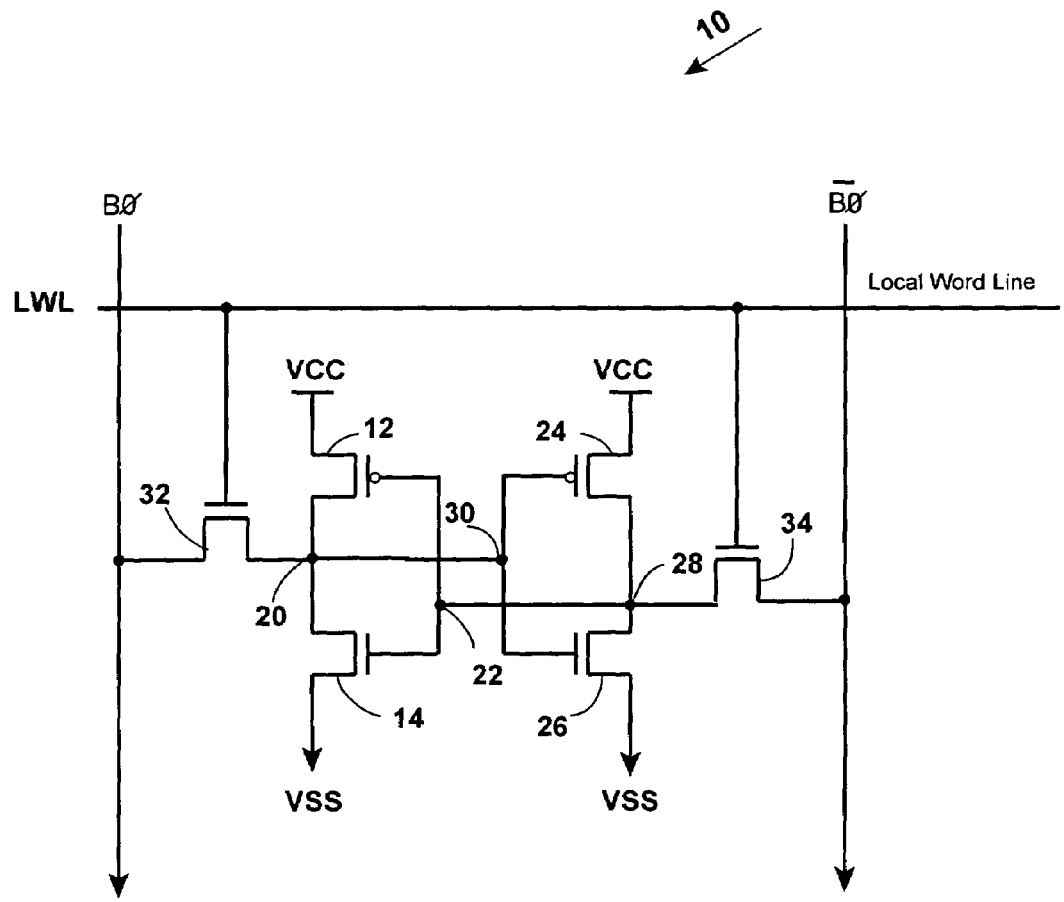
FIG. 1 is a circuit diagram of a 6T SRAM memory cell.
Figure 2:
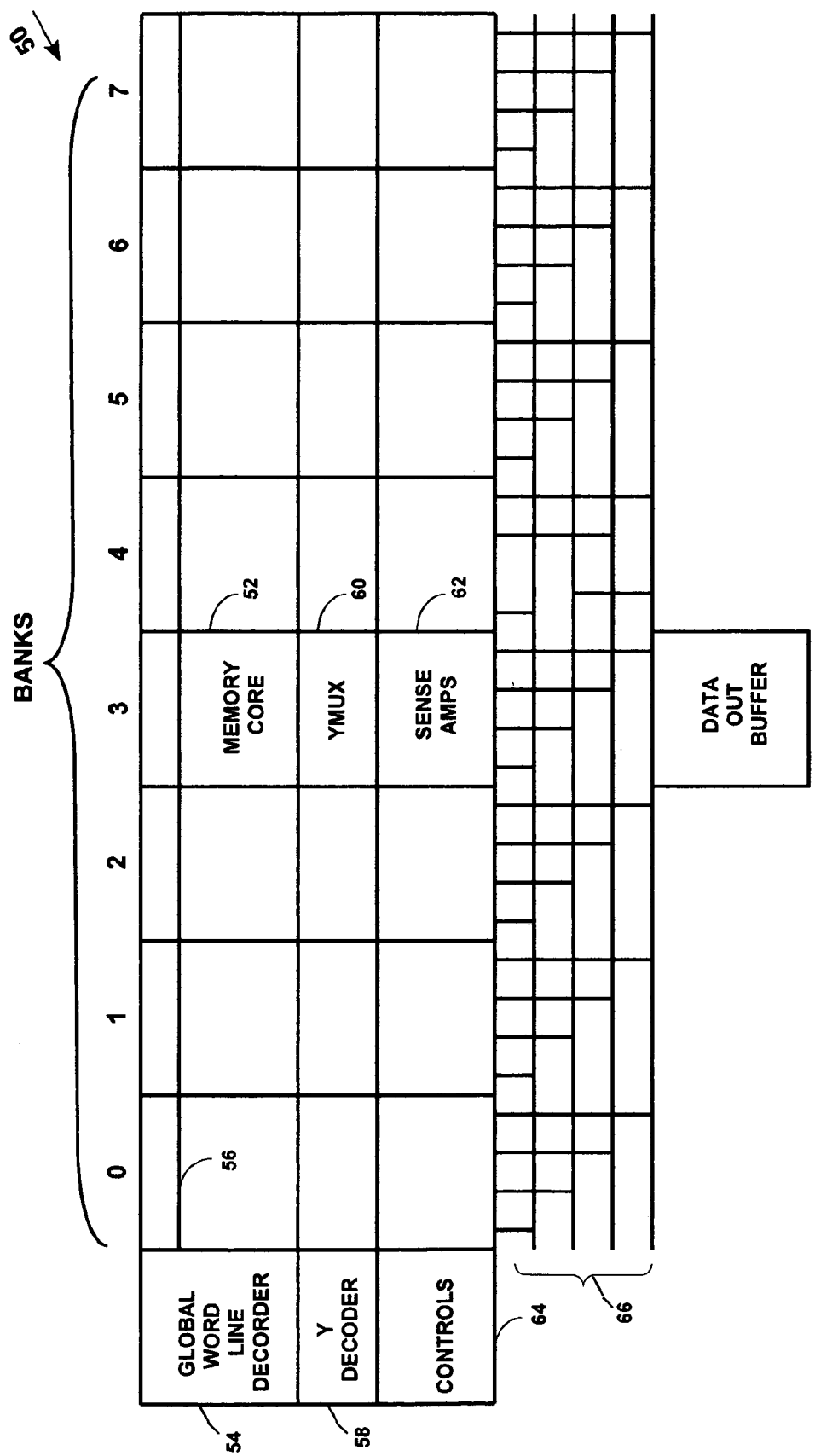
FIG. 2 is a schematic diagram of a prior art SRAM memory chip.
Figure 3:
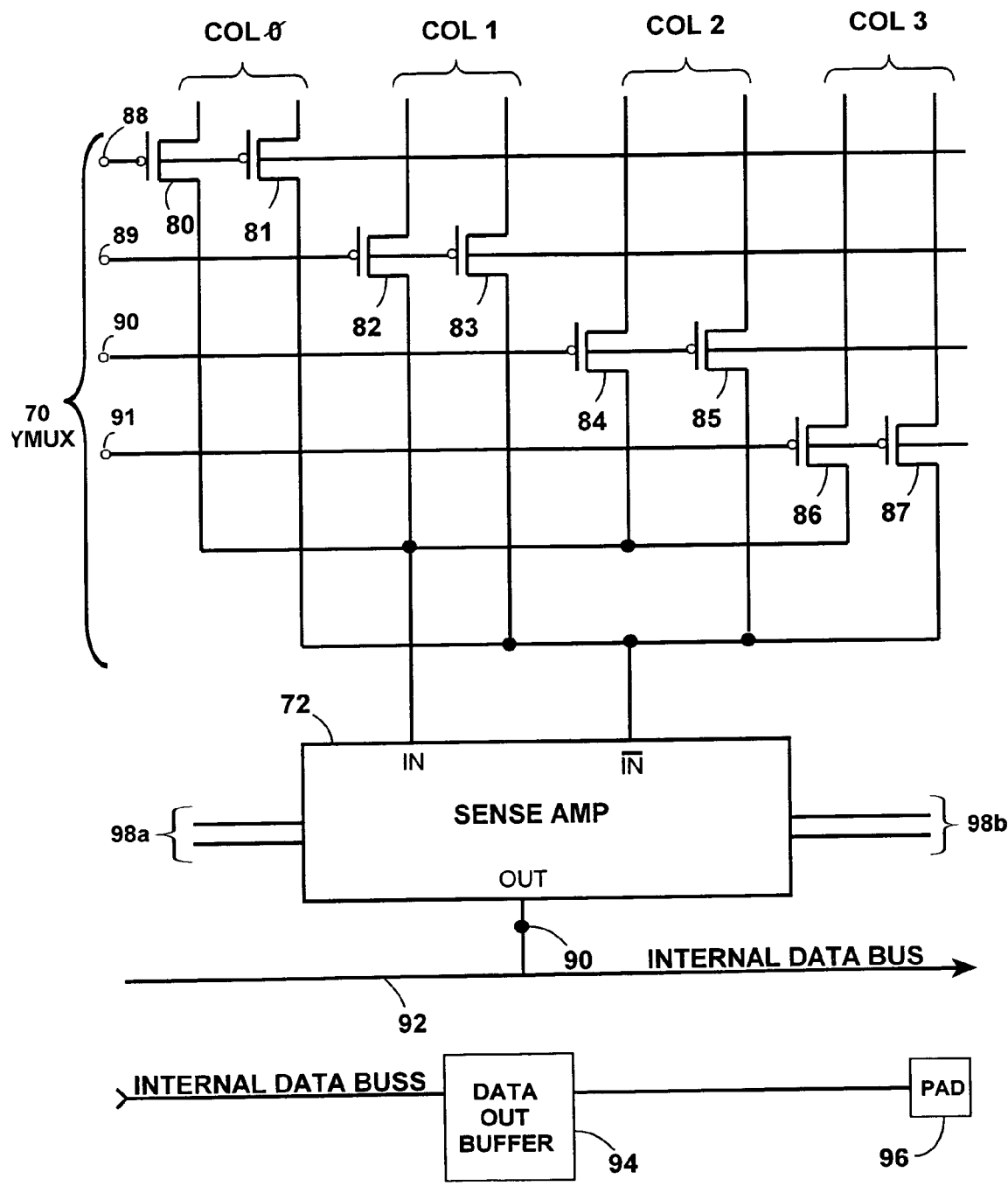
FIG. 3 a more detailed circuit diagram of a YMUX and sense amplifier configuration used in a prior art SRAM memory chip.

The exemplary SRAM 100 according to the present invention includes a number of memory banks, illustrated in FIG. 4 as eight memory banks 0–7, with only one of the memory banks being used at a time. A typical memory core 102 for the SRAM 100 is shown as bank3 and includes a number of the memory cell circuits, as illustrated in FIG. 1, that are arranged in rows and columns. A global word line decoder 104 decodes x address signals and provides a global word line signal on a GWL signal line 106 for corresponding word lines in the memory banks. The global word line signal is then further decoded to a local word line for each bank by an appropriate bank select signal.

The SRAM 100 has a Y-decoder circuit 108 that decodes y address signals for a particular column in a particular memory bank. Each memory bank has a corresponding YMUX circuit, typically shown for memory bank 3 as 110 for selecting that particular memory column.

A 150 mv signal from a bit line or inverted bit line is passed through the YMUX circuit 110 directly to a corresponding line in an internal data bus 112. The 150 mv signals from the bit lines and inverted bit lines are thereby passed directly onto a low-voltage-swing internal data bus. The signals on the internal data bus have 150 mv swings. As a consequence, the internal data bus 112 no longer has a large rail-to-rail, logic voltage swing so that lower power is consumed by the SRAM 100.

The present invention has sense amplifiers and data out buffers 114 that are both located next to I/O pads. The sense amplifiers detect the low-level voltages or voltage differences from a memory circuit on the internal data buss and amplifies those low-level signals to full logic voltage levels near the output pads. These low-levels signals are on the order of 150 millivolts while the full logic voltage output signals are in the order of one or more volts. Note that the voltage value of the low-level 150 mv differential signals from a memory is presented as an example of such a voltage and may vary depending upon various chip design parameters. The present invention is intended to cover other variation in the level of the differential signals. The full logic voltage output signals of the sense amplifiers then appear only near the output pads. With this arrangement, there are only full high-to-low, or low-to-high, rail-to-rail, logic voltage swings at the output pads.

Appropriate timing and control signals for the sense amplifiers are provided by a control circuit 118. In one preferred embodiment of the invention. The sense amplifiers and data output buffers 114 are physically located beneath the internal data buss 112 near the control circuit 118 and near the output terminals or pads.

Figure 5:
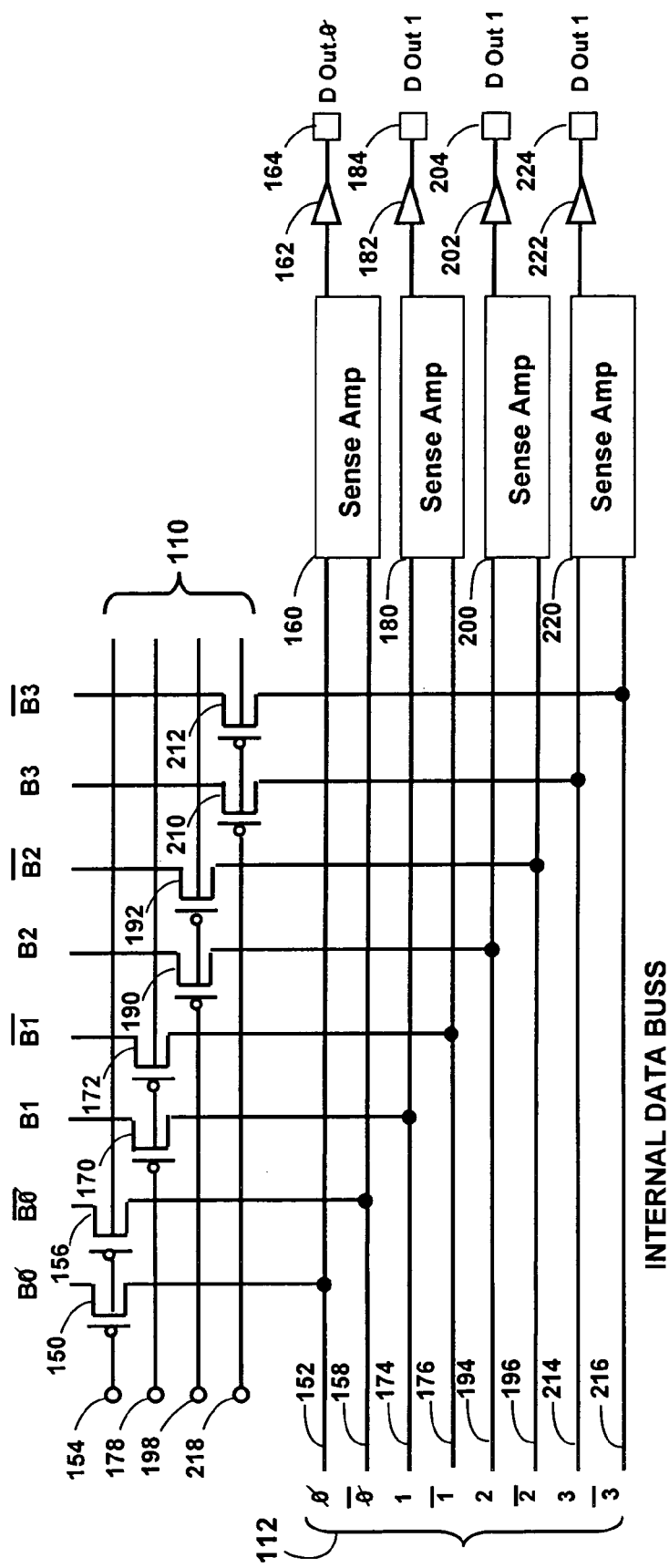
FIG. 5 is a more detailed circuit diagram of a YMUX and sense amplifier configuration used in a SRAM memory chip according to the present invention.

FIG. 5 is a more detailed circuit diagram of the YMUX circuit 110 for four columns of the Core3 102 of Bank 3 of the SRAM 100 arrangement of FIG. 4. The YMUX circuit 110 is configured as a 1:1 multiplexer circuit to avoid wasting power by not having more than one column at a time selected for reading in the CORE3 102. Using the 1:1 YMUX circuit 110 provides that the local word line is not addressing memory cells that are discharging bit lines that are not connected through a YMUX circuit 110.

As an example for the CORE3 memory-cell array of Bank3, the YMUX circuit 110 is shown as being able to select bitline/inverted-bitline signals on one of four pairs of bitlines and inverted bitlines B0,B0*; B1,B1*; B2,B2*; B3,B3* for respective columns COL0, COL1, COL2, COL4 of CORE 3 for the bank 3.

For COL0, a bitline for a 150 mv B0 signal is connected to a drain terminal of a PMOS transistor 150 that has a source terminal connected to a 0-bit line 152 of the internal data bus 112. A gate terminal of the PMOS transistor 150 is connected to a bank selection output terminal 154 of the Y decoder 108 of FIG. 4.

For COL0, an inverted bitline for a 150 mv inverted B0* signal is connected to a drain terminal of a PMOS transistor 156 that has a source terminal connected to an inverted O-bit line 158 of the internal data bus 112. A gate terminal of the PMOS transistor 156 is connected to the bank selection output terminal 154 of the Y decoder 108.

The 0-bit line 152 and the inverted 0-bit line 158 are connected to respective input terminals of a 0-bit differential sense amplifier 160. An output terminal of the sense amplifier 160 is connected to an input terminal of a data out buffer 162. An output terminal of the data out buffer 162 is connected to a 0-bit I/O pad 164. The present invention provides that sense amplifiers and data out buffers are both located beneath the internal data bus 112 near the control circuit 118 of FIG. 4 with the I/O pads nearby. The sense amplifiers detect the low-level voltages or 150 mv voltage differences from a memory circuit on the internal data buss and amplifies those low-level signals to full logic voltage levels near the output pads. These low-levels signals are on the order of 150 millivolts while the full logic voltage output signals are in the order of one or more volts. The full logic voltage output signals of the sense amplifiers then appear only near the output pads. With this arrangement, there are only full high-to-low, Low-to-high, rail-to-rail, logic voltage swings near the output pads and the internal data bus handles only low-level, e.g. 150 mv, voltage swings on one or the other lines of a line pair. These low-level signals require much less power than conventional VSS/VDD logic voltage swings.

Similar components and connections are provided for all of the banks in the SRAM.

FOR COL1, a bitline signal B1 and inverted bitline signal B1* are connected through respective PMOS transistors 170, 172 to the 1-bit line 174 and to the inverted 1-bit line 176. Gate terminals of the PMOS transistors 170, 172 are connected to a bank selection output terminal 178 of the Y decoder 108 of FIG. 4. The 1-bit line 174 and the inverted 1-bit line 176 are connected to respective input terminals of a 1-bit differential sense amplifier 180. An output terminal of the sense amplifier 180 is connected to an input terminal of a data out buffer 182. An output terminal of the data out buffer 182 is connected to a 0-bit I/O pad 184.

FOR COL2, a bitline signal B2 and inverted bitline signal B2* are connected through respective PMOS transistors 190, 192 to the 1-bit line 194 and to the inverted 1-bit line 196. Gate terminals of the PMOS transistors 190, 192 are connected to a bank selection output terminal 198 of the Y decoder 108 of FIG. 4. The 1-bit line 194 and the inverted 1-bit line 196 are connected to respective input terminals of a 1-bit differential sense amplifier 200. An output terminal of the sense amplifier 200 is connected to an input terminal of a data out buffer 202. An output terminal of the data out buffer 202 is connected to a 2-bit I/O pad 204.

FOR COL3, a bitline signal B3 and inverted bitline signal B3* are connected through respective PMOS transistors 210, 212 to the 1-bit line 214 and to the inverted 1-bit line 216. Gate terminals of the PMOS transistors 210, 212 are connected to a bank selection output terminal 218 of the Y decoder 108 of FIG. 4. The 1-bit line 214 and the inverted 1-bit line 216 are connected to respective input terminals of a 1-bit differential sense amplifier 220. An output terminal of the sense amplifier 220 is connected to an input terminal of a data out buffer 222. An output terminal of the data out buffer 222 is connected to a 3-bit I/O pad 224.

Some SRAMs designed according to the present invention have more than the four output terminals 164, 184, 204, 224 illustrated in FIG. 5. As an example, a memory bank of an SRAM with twenty columns provides data signals to twenty data output terminals. The 150 mv bit line signals and 150 mv inverted bit line signals of a selected row of the twenty columns are passed through twenty respective pairs of 1:1 YMUX circuits and onto twenty pairs of internal data bus lines. The signals on the twenty pairs of internal data bus lines are still at the 150 mv level. The 150 mv signals on each pair of internal data bus lines are converted in respective differential sense amplifiers to single-ended data signals at full logic levels. Respective data buffers provide output signals at respective I/O pads. For a SRAM with twenty I/O pads, the present invention requires an internal data bus width of 40 data lines, half of which swing with a 150 mv signal because only half of the 20 bit lines and the 20 inverted bit lines change state when respective memory cells are connected to their bit line and to their inverted bit line. The 150 mv signal on either a bit line or an inverted bit line is detected in a sense amplifier located near an I/O pad.

Figure 6A:
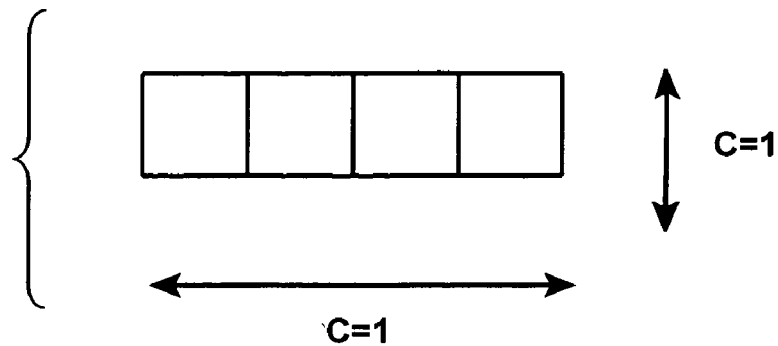
FIG. 6A an optimized SRAM with four banks where each bit-line within a bank has a capacitance equal to that of an internal data bus segment for that bank.
Figure 6B:
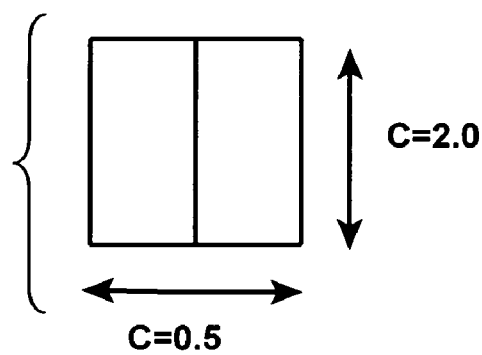
FIG. 6B illustrates a SRAM with only two banks and twice the number of rows of FIG. 6A.
Figure 6C:
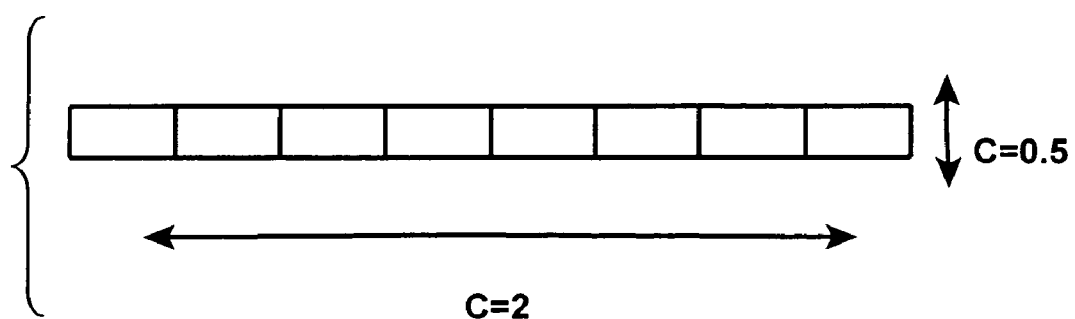
FIG. 6C Illustrates a SRAM with eight banks and half of the rows of FIG. 6A.

FIGS. 6A, 6B, 6C illustrate several SRAM bank/row configurations for a given total number of SRAM memory cells. Each of these configurations uses a certain amount of power for driving a signal line within that SRAM configuration. Power consumed by a signal is proportional to $(EC_T)/T$, where E is the voltage swing, $C_T$ is the total line capacitance of the signal line, and T is the period of a signal on the signal line. The present invention limits power consumption by limiting voltage swings E on an internal data bus to swings of 150 mv, rather than full logic swings of one or more volts, depending on the VCC voltage for a particular SRAM.

Lower power is also consumed by having lower total line capacitance $C_T$ for a signal line. Current static random access (SRAM) chip architectures use six-transistor (6T) memory cells. Connections for a bit line (BL) and for a complementary bit line (BLN) of a 6T SRAM are run in either a metal 2 connection layer or a metal 3 connection layer, but not in both metal connection layers together. The 6T memory cells are arranged in rows and columns, where each column of memory cells has a common bit line and a common complementary bit line.

If the directions in a DRAM chip are visualized as orthogonal three-dimensional x, y, and z directions, each metal connection layer can be thought of as generally being in a horizontal, or x, y plane. Each metal connection layer, such as a metal 2 layer or a metal 3 layer, is then thought of as being located in a separate horizontal plane, where the horizontal planes are vertically spaced over each other in the z direction. The bits lines and the complementary bit lines for a column of 6T memory cells are visualized as generally running in the y direction in a horizontal plane, with a row of memory cells running in the x direction. A bit line and its complementary bit line run parallel to each other in the same metal layer, or horizontal plane. The bit lines and the complementary bit lines for a column of memory cells also run parallel and alongside of the neighboring bit lines and complementary bit lines of neighboring columns of memory cells.

For a SRAM, total line capacitance for a bit is the sum of the capacitance of a bit-line $C_{BL}$ within a memory bank and the capacitance of an internal data bus $C_{IDB}$ for that bit. A 4:1 ratio is assumed between bit-line capacitance per micron and the capacitance per micron of an internal data bus for a bit.

FIG. 6A illustrates that, for an SRAM with four banks where each bit-line within a bank has a capacitance equal to one fourth of an internal data bus segment for that bank, the capacitance $C_{IDB}$ of an internal data bus segment for each bank is 0.25 capacitance units per bank and the bit-line capacitance $C_{BL}$ of a bank is 1.0 capacitance units per bank. Thus the total line capacitance $C_T$ for the four-bank configuration of FIG. 6A is 2.0 capacitance units.

FIG. 6B illustrates that reducing the number of banks to two provides a bit-line capacitance $C_{BL}$ of 2.0 capacitance units per bank and a capacitance $C_{IDB}$ for the two banks of 0.5 capacitance units. Thus the total line capacitance $C_T$ for the two-bank configuration of FIG. 6B is 2.5 capacitance units.

FIG. 6C illustrates that increasing the number of banks to eight provides a bit-line capacitance $C_{BL}$ of 0.5 capacitance units per bank and a capacitance $C_{IDB}$ for the eight banks of 2.0 capacitance units. Thus the total line capacitance $C_T$ for the eight-bank configuration of FIG. 6B is 2.5 capacitance units.

FIG. 6A illustrates that the four-bank configuration provides the lowest total capacitance $C_T$ of 2.0 capacitance units. An optimum arrangement for minimal total capacitance $C_T$ is found when the capacitance $C_{IDB}$ of the internal data bus is equal to the capacitance $C_{BL}$ of the bit line of the core of a memory bank. Note that the capacitance per micron for the internal data bus is a fraction of that of the bit lines. So for lower power, the memory has fewer rows with a lot more columns, making the memory almost 4 times wider than its height. The internal data bus runs along this wide width.

Figure 7:
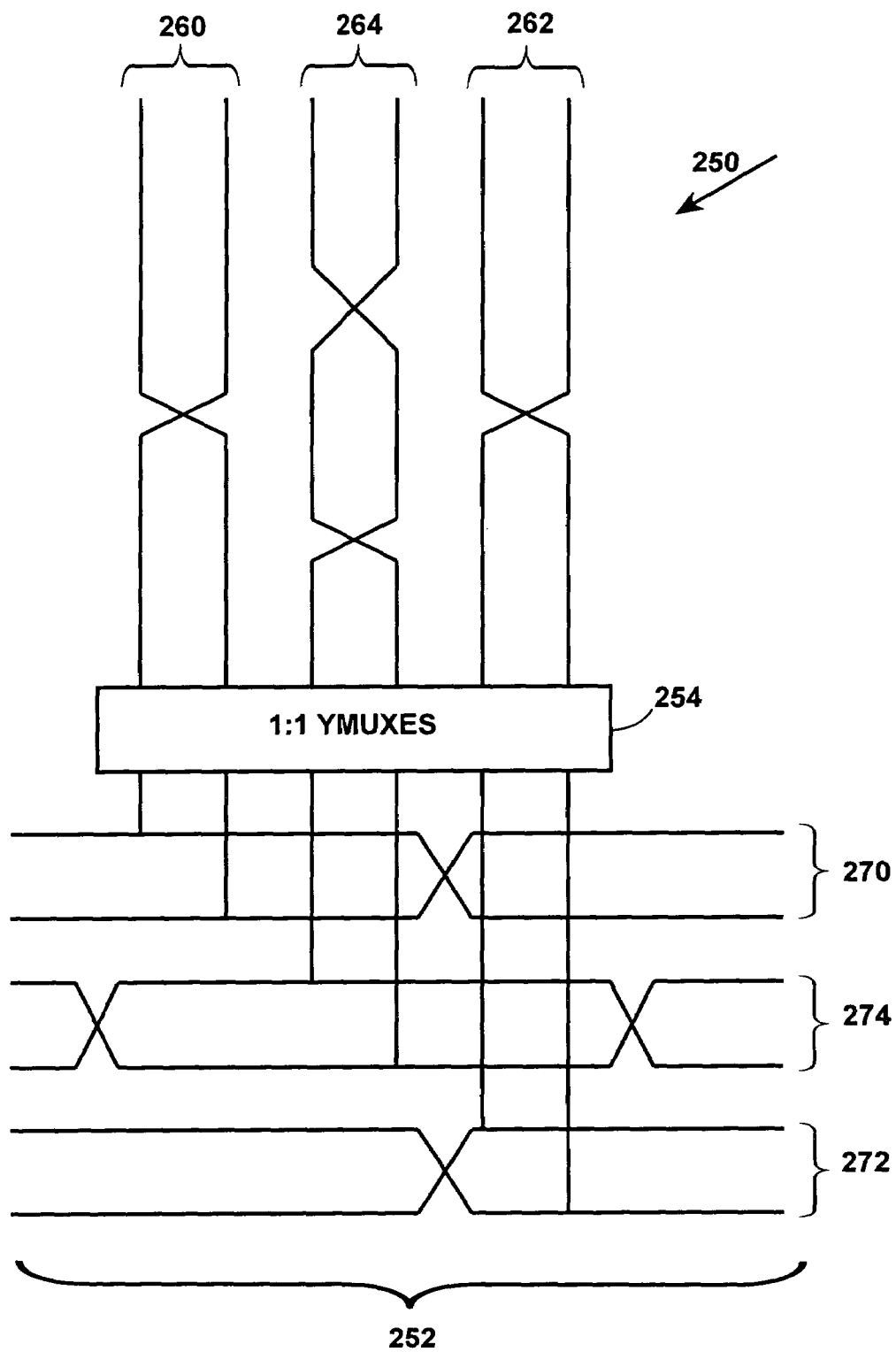
FIG. 7 is a diagram illustrating twisting of signal lines to reduce capacitance coupling between signal lines in a SRAM according to the invention.

FIG. 7 shows a simplified diagram that illustratively shows a bitline group 250 of three pairs of bitlines and inverted bitlines that are horizontally twisted to reduce capacitance. FIG. 7 also shows an internal data bus group 252 of three pairs of signal lines for an internal data bus that are horizontally and vertically twisted to reduce capacitance. The capacitances of the lines for the bitline group 250 in the core of a memory bank and for the entire the internal data bus group 252 for the internal data bus are approximately the same. For purposes of illustration, only three line pairs are illustrated for the groups 250, 252. An actual SRAM according to the present invention can have twenty or more line pairs. Assume that four memory banks are used having the configuration of FIG. 6A. As discussed in connection with FIG. 6A, an optimum arrangement for minimal total capacitance $C_T$ is found when the capacitance $C_{IDB}$ of the internal data bus is equal to the capacitance $C_{BL}$ of the bit line of the core of a memory bank.

Each bitline and inverted bitline pair of the group 250 is gated through respective transistors of a 1:1 YMUX multiplexer 254 that is similar to the 1:1 YMUX circuit 110 of FIG. 5. Respective output terminals of the 1:1 YMUX 254 are connected to corresponding signal lines of pairs of signal lines in an internal data bus 252.

A 150 mv signal from a bit line or inverted bit line is passed through the YMUX circuit 254 directly to a corresponding line in the internal data bus 252. Each line of the pair has a 150 mv signal on one line, either the bitline or the inverted bitline.

Bitline pairs 260,262 of the bitline group 250 each have a single standard twist, that is, one horizontal twist in their length. Alternate line pairs, represented by the bitline pair 264, each have two horizontal twists in their length. Note that 210 and 264 together form a standard triple twist. Twist of the line pairs is accomplished in twist regions by utilizing a metal layer that is either higher or lower than the original metal level to provide appropriate crossover connections for a horizontal twist. After the twist, both the bitline and the inverted bitline still run in the same metal layer. For example, if the metal lines are in metal layer 2, either metal layer 1 or 3 is used to provide crossover connections for the metal lines that still remain in metal layer 2. Horizontal twisting reduces coupling between the lines of neighboring columns, but does not affect the coupling between a particular column's own bitline and inverted bit line because they are still adjacent to each other in the same metal plane. At various places along the various bitline pairs 260, 264, 262 memory cells are located and connected thereto.

Internal data bus signal line pairs 270, 272, 274 of the internal data bus group 252 each have both horizontal and vertical twisting. The digit lines of the line pair are both vertically and horizontally offset with respect to each other so that one line of a pair is in one horizontal connection layer and in one vertical plane while the other line is in the other horizontal connection layer and in another vertical plane. The differential output signal lines from all of the various YMUX circuits are connected at various points along the internal data bus, as diagrammatically indicted in FIG. 7 (not to scale). Sense amps and output data buffers are located beneath one end of the internal data bus.

Each of the internal data buss digit lines has at least one vertical shift zone in which each digit line shifts between the first and the second vertically-spaced horizontal connection layers. Each of the digit lines has at least one horizontal shift zone formed in the same one of the first and second vertically spaced connection layers such that the horizontal shift zone keeps each digit line in the same connection layer.

Data bit lines in the core have horizontal twist only. Internal Data Buss bit lines have horizontal and vertical twist. The internal data buss digit lines are vertically twisted so that the digit lines do not lie next to each other in the same horizontal plane. A vertical shift zone is provided with vertical conductive connections. The vertical shift zone is located in a crossover channel that runs across a number of pairs of internal data buss digit lines for various columns of SRAM cells. The horizontal shift zone is located in a crossover channel that runs across a number of pairs of digit lines for various columns of SRAM cells. The pairs of digit lines are connected to two or more SRAM cells in a column of such cells. The pairs of internal data buss digit lines have alternate vertical shift zones and horizontal shift zones formed in the crossover channel.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A SRAM memory having an internal data bus with reduced internal signal levels, comprising:
    a plurality of memory-cell banks, with each bank of memory cells having a core in which the memory cells are arranged in word rows and bit columns;
    each bank receiving a local word line signal for selecting a row of memory cells and for connecting a selected memory cell of a column to a respective bit-line pair for that column to provide a low voltage differential voltage signal from a memory cell to a bit-line pair for that respective bit column;
    a Y-multiplexer for directly connecting each bit-line pair of a respective column to one end of a corresponding pair of differential data bitlines of an internal data bus while still substantially maintaining low voltage differential voltage level signals on the pairs of differential data bitlines of the internal data bus;
    differential sense amplifier/output buffers, each connected to the other end of a respective pair of differential data bitlines of the internal data bus, each of said sense amplifier/output buffers receiving low voltage differential voltage level signals from a corresponding bit-line pair, and each of said sense amplifier/output buffers having output signals that are full logic level signals;
    a plurality of SRAM data output terminals, adjacent to each of which is located a corresponding differential sense amplifier/output buffer that provides full logic level signals to that SRAM data output terminal; and
    whereby the internal data bus is a differential data bus that carries low voltage differential voltage level signals that are not full logic levels from memory cells to the differential sense amplifier/output buffers to thereby reduce power consumed by not driving full logic levels signals through the internal data bus.

2. The SRAM of claim 1 wherein the differential sense amplifier/output buffers are located beneath one end of the internal data bus near the SRAM data output terminals.

3. The SRAM of claim 1 wherein bit-line pairs in a memory core are formed as twisted pairs and as adjacent twisted pairs in lower metal layers of the SRAM.

4. The SRAM of claim 3 wherein twists include horizontal twists.

5. The SRAM of claim 1 wherein lines of the differential data bitlines in the internal data bus are formed as twisted pairs and as adjacent twisted pairs in upper metal layers of the SRAM.

6. The SRAM of claim 5 wherein twists include horizontal and vertical twists.

7. The SRAM of claim 1 wherein the capacitance of the bit-line pairs in each core of a memory bank are approximately the same as the capacitance of the internal data bus for all of the memory banks to minimize the total capacitance of the lines from a memory cell to an output terminal.

8. The SRAM of claim 1, further comprising a global wordline decoder that receives a row x address and that provides, along with a bank address, the local word line signals for memory cells in a bank such that one bank at a time is accessed for a predetermined row in said bank.

9. The SRAM of claim 1, further comprising a Y-decoder circuit that decodes y column address signals for a particular column in a particular memory bank.

10. The SRAM of claim 1 wherein timing and control signals for the sense amplifiers are provided by a control circuit.

11. A method of routing signals through a SRAM comprising the steps of:
    arranging a plurality of banks of memory cells in rows and columns, with each bank of memory cells having a core in which the memory cells are arranged in word rows and bit columns;
    each memory cell in a bank receiving a local word line signal for selecting a row of memory cells and for connecting the memory cells of a column to a respective bit-line pair to provide a low voltage differential voltage signal from a memory cell to a bit-line pair for a respective bit column;

directly connecting each bit-line pair of respective columns through a Y-multiplexer circuit to one end of a corresponding pair of differential data bitlines in an internal data bus while substantially maintaining low voltage differential voltage level signals on the pairs of differential data bitlines of the internal data bus;

connecting differential sense amplifier/output buffers to the other end of a respective pair of differential data bitlines in an internal data bus, each of said sense amplifier/output buffers receiving low voltage differential voltage level signals from a corresponding bit-line pair, and each of said sense amplifier/output buffers having output signals that are full logic level signals;

locating corresponding differential sense amplifier/output buffers adjacent to one of a plurality of SRAM data output terminals, each of which buffers provides full Logic level signals to that SRAM data output terminal;

whereby the differential data bus carries low voltage differential voltage level signals that are not full logic levels from memory cells to the differential sense amplifier/output buffers to thereby reduce power consumed by not driving full logic levels signals through the internal data bus.

12. The method of claim 11 including locating the differential sense amplifier/output buffers beneath one end of the internal data bus near the SRAM data output terminals.

13. The method of claim 11 including forming bit-line pairs in a memory core as twisted pairs and as adjacent twisted pairs in lower metal layers of the SRAM.

14. The method of claim 13 wherein twists are horizontal twists.

15. The method of claim 11 including forming lines of the differential data bitlines in the internal data bus as twisted pairs and as adjacent twisted pairs in upper metal layers of the SRAM.

16. The method of claim 15 wherein twists include horizontal and vertical twists.

17. The method of claim 11 including forming the capacitance of the bit-line in each core of a memory bank to be approximately the same as the capacitance of the internal data bus bit-line for all of the memory banks to minimize the total capacitance of the lines from a memory cell to an output terminal.

* * * * *